United States Patent [19]

Alexander

[11] Patent Number: 5,794,450
[45] Date of Patent: Aug. 18, 1998

[54] REMOTELY LOCATED PULSE TUBE FOR COOLING ELECTRONICS

[75] Inventor: Arthur Ray Alexander, Valley Center, Calif.

[73] Assignee: NCR Corporation, Dayton, Ohio

[21] Appl. No.: 778,931

[22] Filed: Jan. 3, 1997

[51] Int. Cl.$^6$ ...................................................... F25B 9/00
[52] U.S. Cl. ................................................ 62/6; 62/467
[58] Field of Search ................................................ 62/6, 467

[56] References Cited

U.S. PATENT DOCUMENTS

| | | | |
|---|---|---|---|
| 5,275,002 | 1/1994 | Inoue et al. | 62/6 |
| 5,335,505 | 8/1994 | Ohtani et al. | 62/6 |
| 5,365,749 | 11/1994 | Porter. | |
| 5,481,878 | 1/1996 | Shaowei | 62/6 |
| 5,515,685 | 5/1996 | Yanai et al. | 62/6 |
| 5,522,223 | 6/1996 | Yanai et al. | 62/6 |

*Primary Examiner*—Ronald C. Capossela
*Attorney, Agent, or Firm*—Merchant, Gould, Smith, Edell, Welter & Schmidt

[57] ABSTRACT

An electrical component cooling system is described which achieves low cooling temperatures for densely packaged electrical components using environmentally friendly working fluids. The cooling system uses a remotely located pressure wave generator to provide working fluid pulses to a plurality of regenerators. The mass flow and pressure relationships effecting cooling for the regenerator is controlled by tuning the pulse tube, orifice, and working fluid reservoir characteristics.

19 Claims, 4 Drawing Sheets

REMOTELY LOCATED PULSE TUBE FOR COOLING ELECTRONICS

BACKGROUND OF THE INVENTION

1. Field of Invention

The present invention relates generally to cooling systems for electrical components, and more particularly, to a cooling system for electrical computer components using a remotely located pulse tube cooler.

2. Description of Related Art

The increase in circuit density and the operating or clock frequency of integrated circuits and other electrical components including the multi-chip computer modules used in present day computer systems have resulted in an exceptional increase in the power dissipated by those components. For example, only a few years ago, the maximum power generated by a typical metal oxide semiconductor (CMOS) central processing unit (CPU) used with a personal computer was approximately two watts. Currently, the INTEL™ Corporation PENTIUM™ processor dissipates approximately sixteen watts, and the PENTIUM PRO™ processor generates nearly thirty-five watts and more at higher clock frequencies. These components must be cooled to prevent damage from the heat internally generated by these devices. Traditional cooling techniques such as convection or radiation into the atmosphere are no longer adequate to provide the heat removal required for these devices.

Device cooling also allows electrical circuits to operate at higher clock speeds, with corresponding increases in processing speeds for computer board applications. In some cases, the processor clock frequency of a CMOS processor has been improved nearly 300% by cooling the processor die to a temperature of approximately –200 degrees Celsius.

Many methods for sub-cooling processors are known, including immersion of the CPU module in a coolant such as liquid nitrogen, interfacing the CPU module with a Peltier thermal electric cooling device (TEC), or using compression cooling refrigeration systems. In each case, the cooling system typically comprises a plurality of hollow cold plates which are thermally coupled to the processors, modules, or other components to be cooled. A liquid coolant is circulated from a refrigeration unit through connecting conduits to the cold heads to effectuate the cooling of the coupled components.

One example of a compression cycle refrigeration system is disclosed in U.S. Pat. No. 5,365,749, issued November 22, 1994 to Porter, which is herein incorporated by reference. In this cooling system, first and second conduits provide a transmission path for the working fluid for the cooling system. The first conduit contains pressurized working fluid, which is evaporated in an expansion chamber in a heat exchanger. This first conduit is disposed coaxially within a second conduit which provides a path to evacuate the evaporated working fluid.

While compression cycle cooling systems are effective, they do not provide cooling below temperatures below 80 degrees Celsius, and usually require the use of environmentally sensitive working fluids. Stirling cycle coolers are offer low cooling temperature and are operable with environmentally friendly working fluids. However, to achieve the desired cooling temperatures, the Stirling cooler itself must be mounted directly to the cooled component. Although this is acceptable for large scale cooling needs such for cooling of large satellites, Stirling coolers are too large to mount directly to smaller heat generating components such as microprocessors. This problem is especially noteworthy in high speed applications where speed is of the essence and the processors must be packaged close together to minimize signal flight time.

SUMMARY OF THE INVENTION

To ameliorate the above-noted limitations, the present invention provides an apparatus and method for cooling electrical components with a remotely located pulse tube. In one embodiment, the present invention comprises a pressure wave generator which delivers pulses of working fluid from a reservoir to a regenerator thermally coupled to a heat-generating electrical component. A pulse tube is coupled to the regenerator and an orifice which communicates working fluid to a reservoir or surge tank. The physical characteristics of the orifice, reservoir and pulse tube which are tuned to effect a phase relationship between the mass flow and pressure of the working fluid in the regenerator, thereby creating a regenerator chilled surface, cooling the electrical component attached thereto.

DETAILED DESCRIPTION OF THE PREFERRED EMBODIMENT

Figure 1:
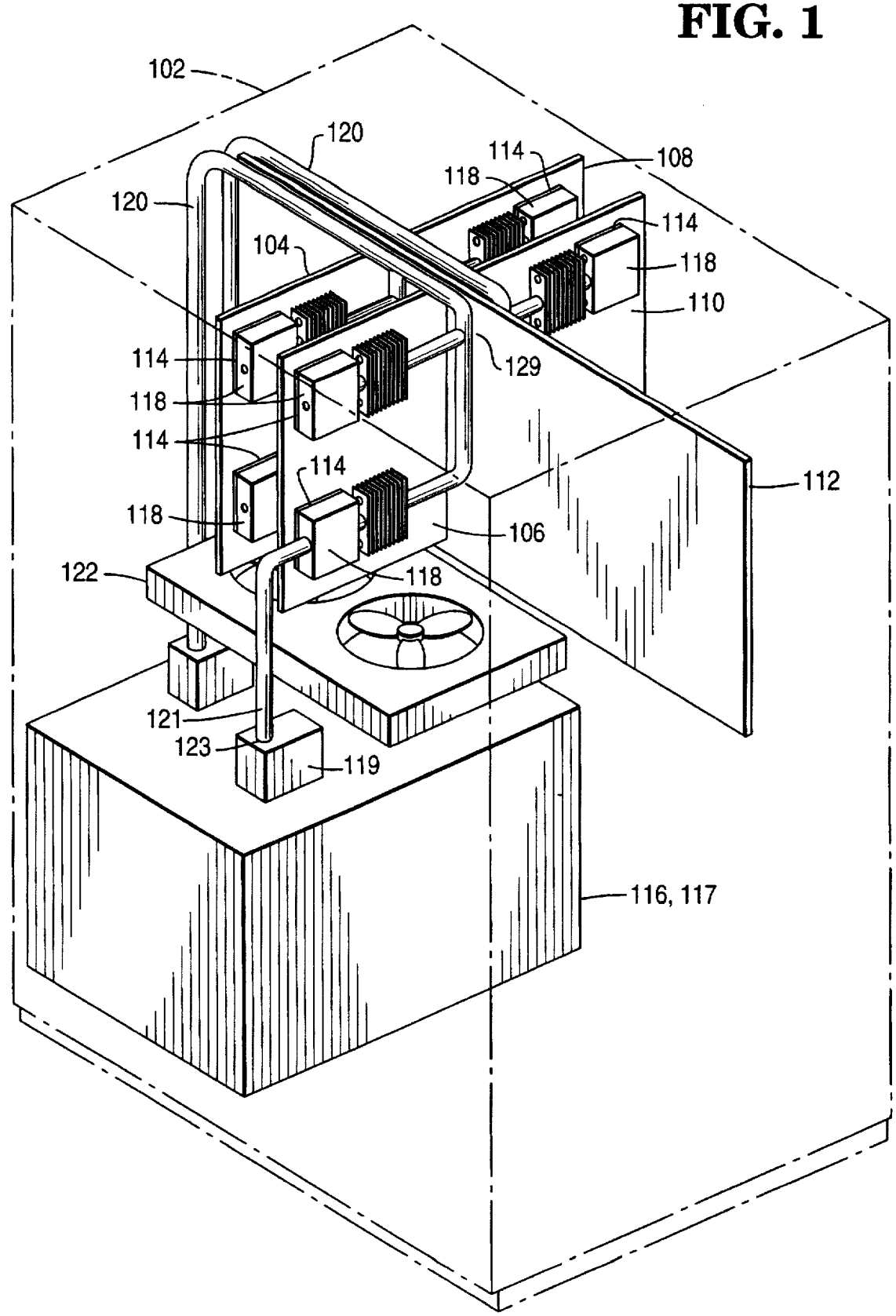
FIG. 1 is a perspective view of a processor cabinet including a plurality of printed circuit boards and the component cooling system according to the present invention.

FIG. 1 is a diagram of a typical processor cabinet 102, shown in outline, which houses the components of a multiple processor computer system and includes a cooling system in accordance with the present invention. Only those components necessary for an understanding of the present invention are shown and discussed herein. The processor cabinetry may additionally house disk drives, power supplies, memory boards and other structures not shown in FIG. 1.

The computer system includes a plurality of processor boards, four of which are shown. These boards, identified by reference numerals 104, 106, 108 and 110, each include electrical contacts along one edge which are press-fitted into mating connectors secured to the surface of a system back panel 112. The back panel 112 provides common connections for the transmission of power, control and data signals between the various components of the computer system. Processor boards 104, 106, 108, and 110, which will be described in greater detail below with reference to FIG. 2, each include two or more processors 114. Also shown in FIG. 1 is a typical fan panel 122 that generates an air flow directed upward across the processor boards 104, 106, 108, and 110, and other components within the cabinet 102.

The primary components of the cooling system shown in FIG. 1 comprise a pressure wave generator 116 and working fluid reservoir 117, a regenerator/heat exchanger 118 affixed to each processor 114, a conduit 120 communicatively connecting each regenerator/heat exchanger 118 with the pressure wave generator 116, a pulse tube 121, and an orifice 119. In one embodiment of the invention, the pressure wave generator 116 is located in the bottom of cabinet 102 to facilitate disconnection of the pressure wave generator 116 from the conduit 120 for removal and service or replacement. The pressure wave generator 116 provides working fluid pulses to each of the regenerator/heat exchangers 118.

Figure 2:
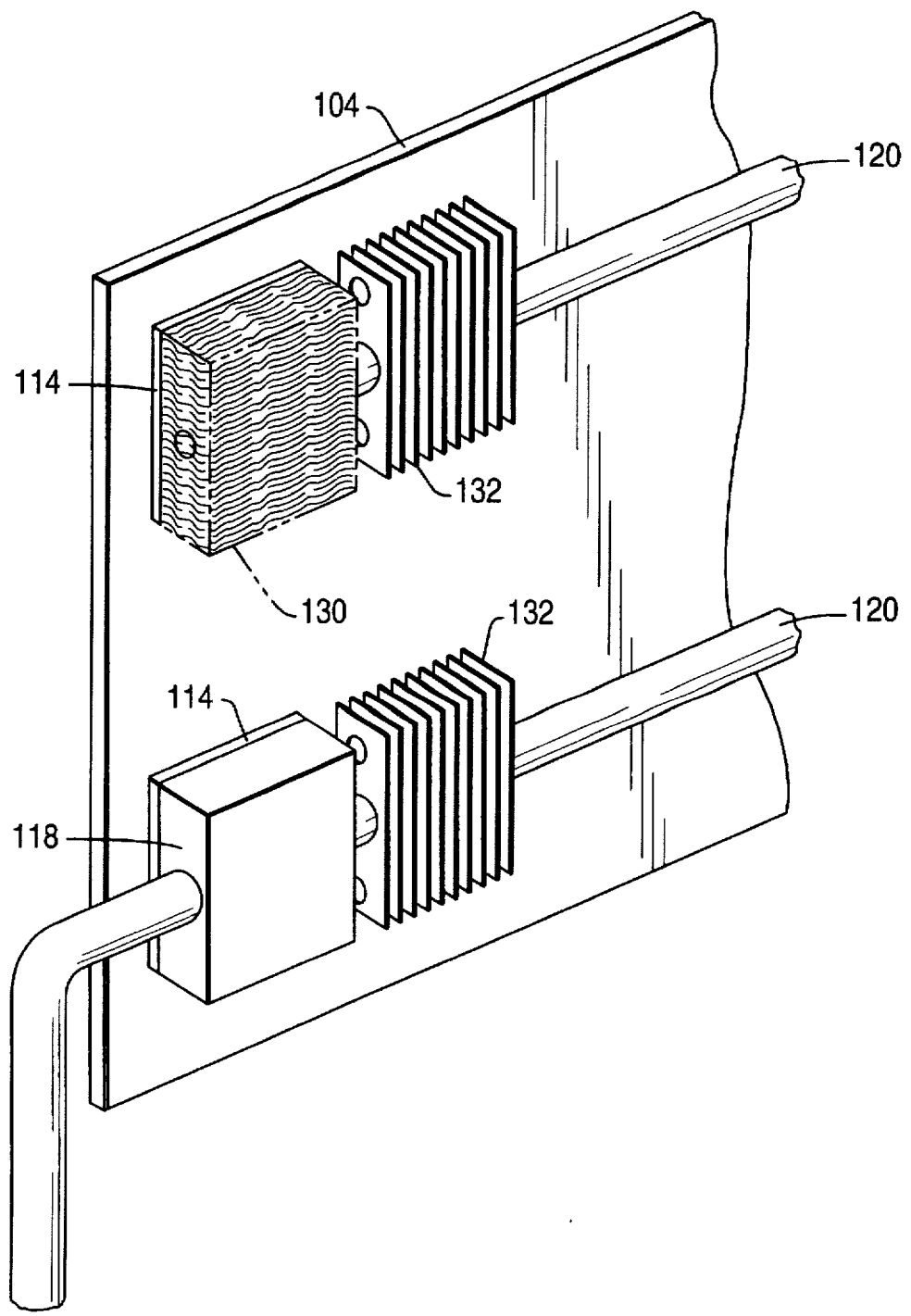
FIG. 2 is a printed circuit board subassembly, shown in perspective view, including two CPUs, corresponding regenerator and other components of the cooling system of the present invention.

Processor board 104 is shown in perspective view in FIG. 2. The processor board 104 is a printed circuit board with attached CPUs 114 as well as other circuit elements which are not shown. It should be noted that although processor board 104 is shown including two CPUs 114, one, two or more processors can be accommodated on each processor board 104 and the cooling system, described herein, designed accordingly.

Attached to each CPU 114 is a regenerator/heat exchanger/cold 118. Although the regenerator/heat exchanger 118 is shown coupled to a CPU, the regenerator/heat exchanger 118 can be used to provide cooling to any component as desired. Conduit 120, which terminates into the regenerator/heat exchanger 118, provides for the delivery of pressurized liquid coolant from the pressure wave generator 116 to the heat exchanger/cold head assembly 118. Pulse tube 121 which provides for the return of the working fluid from regenerator/heat exchanger 118 to a working fluid reservoir 117 via orifice 123 where it is made available to the pressure wave generator 116 to generate additional working fluid pulses. The shape and interior dimensions of the pulse tube and orifice 123 are selected to control the magnitude and phase relationship between the mass flow and pressure of the working fluid pulses. Further, the length and diameter of conduit 120 and other transportive elements of the system are selected by the system designer to tune the system to achieve the desired cooling effect, but the scope of the present invention is not limited by this selection. Similarly, as shown in FIG. 2, the regenerator/heat exchanger 118 may comprise a regenerator mesh 129, and the system may alternatively include cooling fins 132 thermally coupled to the regenerator/heat exchanger 118 to provide for improved heat dissipation in the event of a refrigeration system failure.

Figure 3:
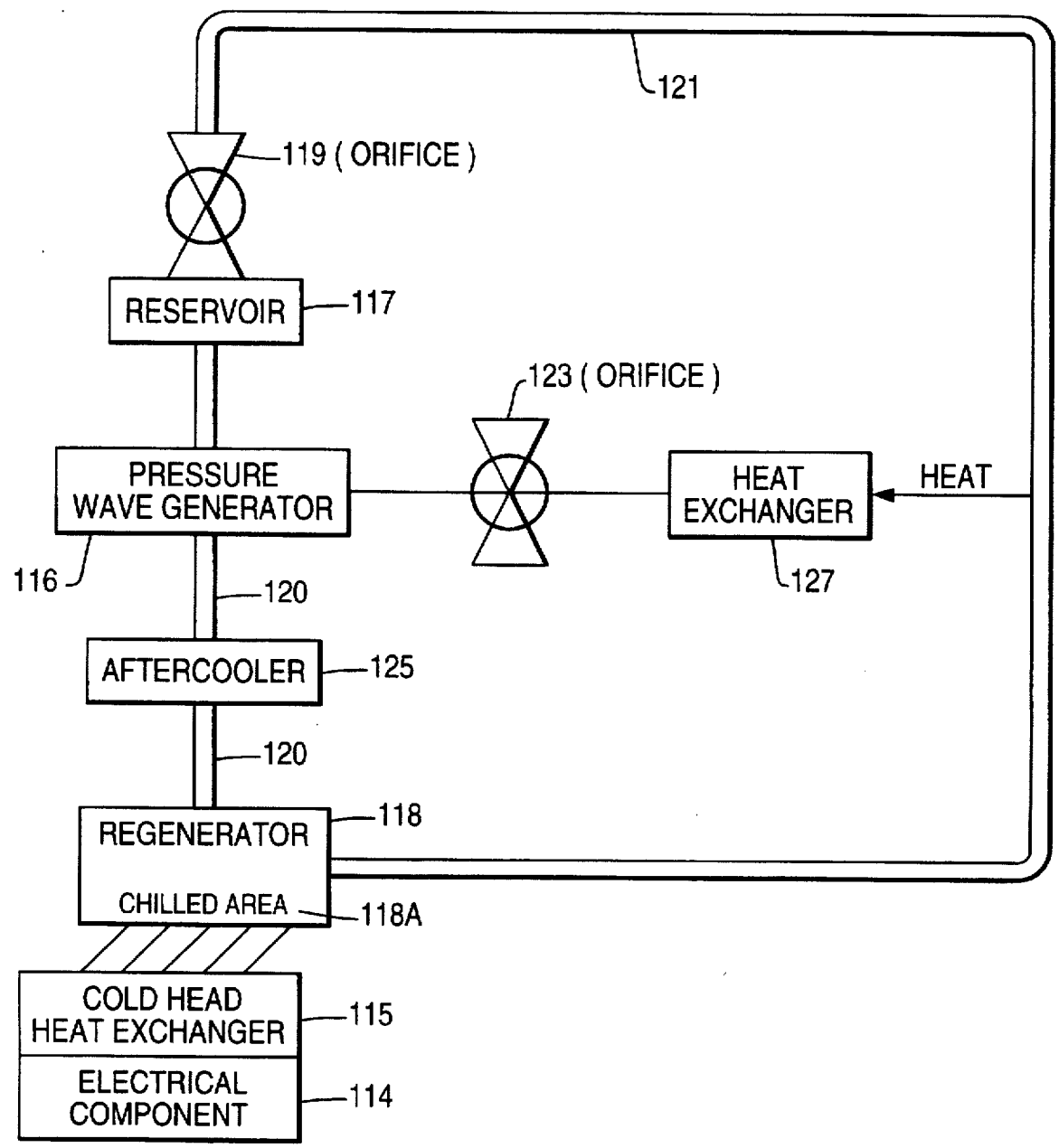
FIG. 3 is a block diagram showing the operation of the present invention.

FIG. 3 presents a diagram describing the operation of the present invention. As described in R. Radebaugh, "A Review of Pulse Tube Refrigeration," Advances in Cryogenic Engineering, Vol. 35, pages 1191–1205 (1989), and S. Zhu P. Wu, and Z. Chen, "Double Inlet Pulse Tube Refrigerators: An Important Improvement," Cryogenics, Vol. 30 pages 514–520 (1990), both of which are hereby incorporated by reference, the operating pressures, volumes, frequencies, temperatures, and loads for the present invention are similar to those encountered for Stirling cryocoolers. However, as will be described herein, the present invention differs from the these devices in the mechanism used to control the magnitude and phase difference between the oscillating pressure and oscillating mass flow in where the cooling is effected. In the Stirling cooler, the relationship between the phase of the mass flow in the cold portion of the regenerator is controlled by the stroke and relative phase of the motion of the piston and the displacer. In the present invention, however, this phase difference is effected by tuning the geometry and other characteristics of the working fluid transportive elements of the system, namely the pulse tube 121, orifice 119, and working fluid reservoir 117. This design allows the magnitude and the phase of the pressure variations to be passively controlled, resulting in a simpler, less expensive system. For example, in a common Stirling cryocooler implementation, the regenerator and the displacer are integrated into a single moving part which must support a large temperature gradient, and must be sealed to close tolerances to prevent gas from bypassing the regenerator. Conversely, in the present invention, a pulse tube 121, which is in essence is an empty piece of pipe, provides a mechanism for using the work supplied by the pressure wave generator 116 and supporting a thermal gradient between the cold head heat exchanger 115 and the orifice 119.

Referring again to FIG. 3, the present invention comprises a pressure wave generator 116 which uses working fluid at ambient temperature in a reservoir 117 to produce oscillating pressures and phase-shifted mass flows of working fluid. These oscillating pressure waves and out of phase oscillating mass flows are optionally provided to aftercooler 125, which reduces the temperature of the compressed working fluid pulses from above ambient temperature $T_{\infty}$ to a desired value $T_a$. The pressure wave generator may be a simple compressor using a free piston, a Stirling cycle attached piston, an acoustic wave generator operating under similar principles as a loudspeaker, or other device. The frequency working fluid pulses is selected to achieve the desired cooling efficiency, and the mechanical resonance of the pressure wave generator 116 is selected to coincide with the desired working fluid pulse frequency.

The working fluid pulses are then provided to a regenerator/heat exchanger 118. The alternating pressure and mass flow produced by the pressure wave generator 116 cause the regenerator/heat exchanger 118 to pump heat from a cooling load attached to the regenerator chilled area or cold head 118A. The regenerator/heat exchanger 118 acts as a thermal sponge, allowing the oscillating working fluid (typically pressurized helium or hydrogen gas, although other working fluids can be used) to pump heat from the cooling load to ambient temperature.

The design of the regenerator/heat exchanger 118 is an important factor in determining the overall cooling efficiency of the present invention. Regenerator/heat exchanger 118 losses are a function of the heat transfer effectiveness between the working fluid and the cooling load, the regenerator/heat exchanger 118 pressure drop, and the heat conducted in the regenerator matrix. The heat transfer and pressure drop in the regenerator/heat exchanger 118 is determined from the mass flow distribution within the regenerator/heat exchanger 118, which, in turn, is a function of regenerator/heat exchanger 118 geometries and the regenerator matrix. In one embodiment, regenerator/heat exchanger 118 is a stack of screen disks, is similar to that employed with a Stirling cooler, differing only in the size required for a particular installation.

In one embodiment, the working fluid pulses from the pressure wave generator 116 are provided to a plurality of regenerator/heat exchangers 118 via a pressure pulse distributor 129. The shape and size of the pressure pulse distributor 129 is selected along with the shape and size of the orifice 119, pulse tube 121, and reservoir 117, as to effect the desired mass flow and pressure relationship as described herein.

Nominally, the cooling load comprises a CPU 114 thermally coupled to the regenerator/heat exchanger 118, but may also optionally comprise a cold end heat exchanger 115 thermally coupled between the regenerator/heat exchanger 118 and the CPU 114. The regenerator/heat exchanger 118 may also optionally pump heat from the aftercooler 125 via the cold end heat exchanger 115. The working fluid pulses are then provided to the pulse tube 121 which terminates into an orifice 119 and working fluid reservoir 117. The shape and size of the pulse tube 121, orifice, 119, and working fluid reservoir 117 is selected to effect the desired magnitude and phase relationship between the mass flow and the pressure of the working fluid pulses in the regenerator/heat exchanger 118.

The pulse tube 121 is fabricated from thin-walled low thermal conductivity material such as stainless steel or titanium. If implemented, the optional cold end heat exchanger 115 and hot end heat exchanger 127 can be screen heat exchangers thermally connected to the pulse tube and copper blocks. The screens can be formed of any suitable thermally conductive material, but should be chosen to allow a good heat transfer to gas.

Optionally, a hot end heat exchanger 127 thermally coupled to the pulse tube 121 rejects heat from the working fluid pulses before they are supplied to the orifice 119. In addition, a bypass orifice 123, communicatively coupled between the hot end heat exchanger 127 and the pressure wave generator 116 may be optionally implemented to enhance system efficiency.

Figure 4:
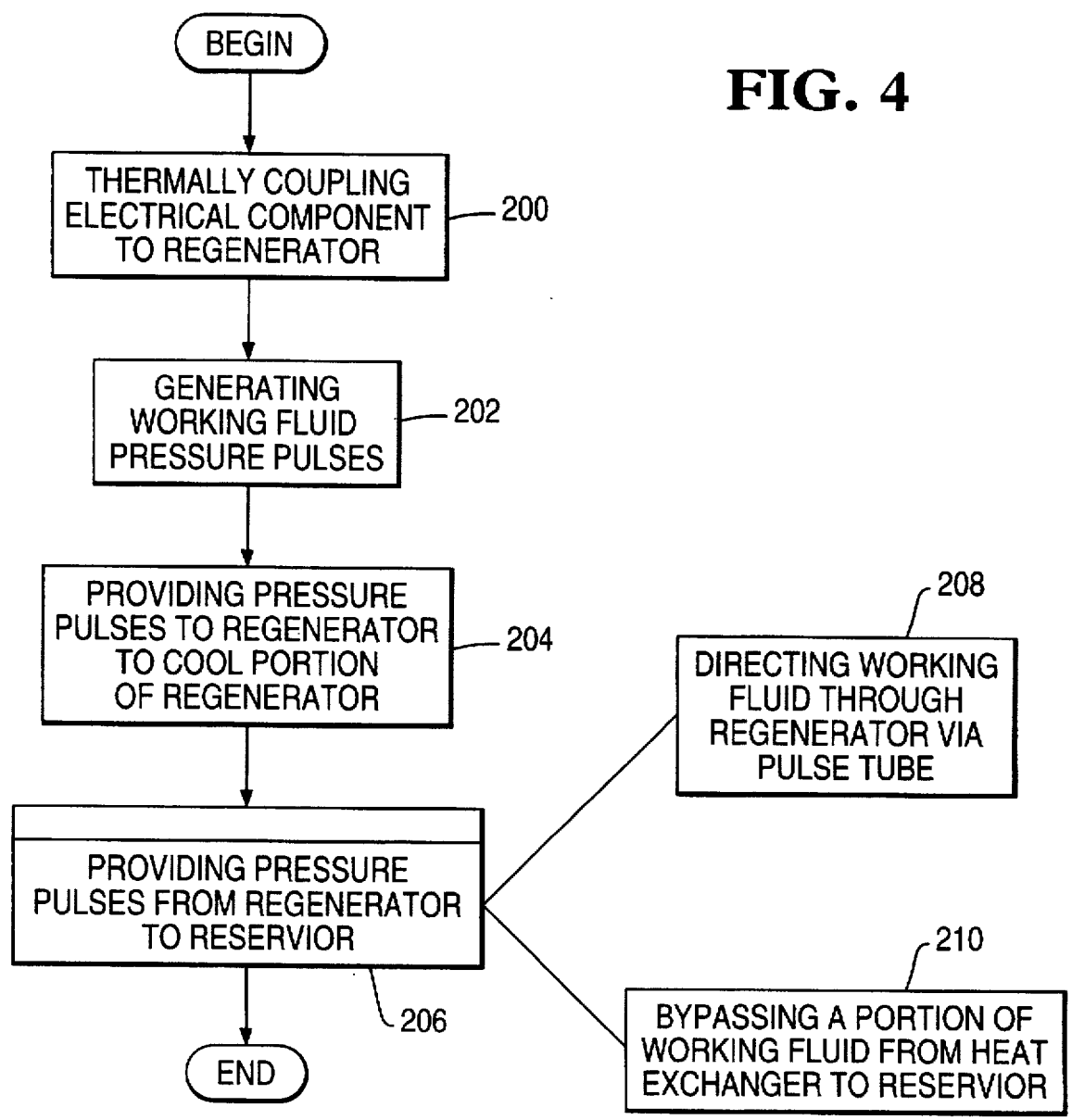
FIG. 4 is a flow chart describing the operations performed in accordance with the present invention.

FIG. 4 is a flow diagram illustrating the operations performed in accordance with the present invention. The process begins by thermally coupling the electrical component to be cooled to the regenerator chilled area 118A. This operation is depicted in block 200. The component can be thermally coupled directly to the regenerator chilled area 118A or coupled via a cold head heat exchanger 115. Next, working fluid pressure pulses are generated 202 and provided to a regenerator 204. This cools the regenerator chilled area 118A, and those devices thermally coupled thereto. Next, the pressure pulses are provided from the regenerator to a reservoir or surge tank 117. This operation is depicted in block 206. To achieve the required phase relationship between the working fluid mass flow and pressure, these pressure pulses are directed through a tuned transmission medium before being directed to the reservoir 117, including any combination of the pulse tube 121, orifice 119, or the reservoir 117 itself. This is depicted in block 208. Optionally, a portion of the working fluid is bypassed from the hot end heat exchanger 127 to the pressure wave generator 116 to improve cooling efficiency.

CONCLUSION

This concludes the description of the preferred embodiment of the invention. In summary, the present invention is an electrical component cooling system for a multi-processor computer system which provides low temperature cooling of densely packaged electrical components with environmentally friendly working fluids. The cooling system comprises a pressure wave generator for delivering working fluid pulses to a remotely located regenerator thermally coupled to the component, a conduit for transmitting the working fluid pulses to the regenerator, and a pulse tube and an orifice for transmitting the working fluid pulses from the regenerator to a reservoir storing working fluid.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. An apparatus for cooling at least one electrical component, comprising:

a pressure wave generator for delivering working fluid pulses characterizable by a mass flow and a pressure to a regenerator remote from the pressure wave generator, the regenerator comprising a chilled area thermally coupled to the electrical component formed when the working fluid pulses pass through the regenerator;

a conduit for transmitting the working fluid pulses to the regenerator, communicatively coupled to the pressure wave generator and the regenerator;

a pulse tube, coupled to the regenerator for communicating the working fluid pulses to a reservoir supplying working fluid to the pressure wave generator; and an orifice coupled between the reservoir and the pulse tube wherein the orifice is tuned to control a phase relationship between the mass flow and pressure of the working fluid in the regenerator.

2. The apparatus of claim 1, wherein the orifice is tuned by adjusting the shape and size of the orifice.

3. The apparatus of claim 1, wherein the regenerator comprises a heat conducting mesh.

4. The apparatus of claim 1, wherein the reservoir shape and size is tuned to control the magnitude and phase relationship between the mass flow and pressure of the working fluid in the regenerator.

5. The apparatus of claim 1, wherein the pulse tube shape and size is tuned to control the magnitude and phase relationship between the mass flow and pressure of the working fluid in the regenerator.

6. The apparatus of claim 1 wherein the pressure wave generator is a free piston.

7. The apparatus of claim 1 wherein the pressure wave generator is a stirling cycle attached piston.

8. The apparatus of claim 1 wherein the pressure wave generator is an acoustic wave generator.

9. The apparatus of claim 1, wherein the pulse tube directs the working fluid through the regenerator to provide heat energy to the regenerator.

10. The apparatus of claim 1, wherein the pulse tube directs the working fluid through a heat exchanger to remove heat from the working fluid.

11. The apparatus of claim 10, further comprising a bypass orifice, communicatively coupled between the heat exchanger and the pressure wave generator.

12. The apparatus of claim 1, wherein the conduit for transmitting the pressure pulses to regenerator further comprises a pressure pulse distributor, coupled between the pressure wave generator and the a plurality of regenerators, each communicatively coupled to a regenerator, comprising a chilled area thermally coupled to an electrical component formed when working fluid pulses pass through the regenerator.

13. The apparatus of claim 12, wherein each regenerator further comprises a pulse tube, coupled to the regenerator for communicating the working fluid pulses to the reservoir.

14. The apparatus of claim 1, comprising a cold head heat exchanger thermally coupled between the regenerator chilled area and the electrical component.

15. A method of cooling at least one electrical component, comprising the steps of:

thermally coupling the electrical component to a regenerator;

generating working fluid pressure pulses characterizable by a mass flow and a pressure;

providing the pressure pulses to the regenerator to cool a portion of the regenerator; and providing the pressure pulses from the regenerator to a reservoir via a pulse tube coupled to the regenerator and an orifice coupled between the reservoir and the pulse tube, wherein the orifice is tuned to control a magnitude and phase relationship between the mass flow and pressure of the working fluid in the regenerator.

16. The method of claim 15, further comprising the step of directing the working fluid through the regenerator via the pulse tube to provide heat energy to the regenerator.

17. The method of claim 15, wherein the pulse tube is coupled to a heat exchanger to remove heat from the working fluid.

18. The method of claim 17, further comprising the step of bypassing a portion of the working fluid from the heat exchanger to the reservoir via an orifice.

19. The method of claim 15, wherein a cold head heat exchanger is thermally coupled between the regenerator and the electrical component.

* * * * *